United States Patent
Cha et al.

(10) Patent No.: US 10,156,995 B2
(45) Date of Patent: Dec. 18, 2018

(54) SEMICONDUCTOR MEMORY DEVICES AND METHODS OF OPERATING THE SAME

(71) Applicant: SAMSUNG ELECTRONICS CO., LTD., Suwon-si, Gyeonggi-Do (KR)

(72) Inventors: Sang-Uhn Cha, Yongin-si (KR); Hoi-Ju Chung, Yongin-si (KR); Ye-Sin Ryu, Seoul (KR); Seong-Jin Cho, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 39 days.

(21) Appl. No.: 15/398,409

(22) Filed: Jan. 4, 2017

(65) Prior Publication Data

US 2017/0308299 A1 Oct. 26, 2017

(30) Foreign Application Priority Data

Apr. 26, 2016 (KR) .................. 10-2016-0050503

(51) Int. Cl.
*G06F 3/06* (2006.01)
*H03M 13/15* (2006.01)
(Continued)

(52) U.S. Cl.
CPC .............. *G06F 3/061* (2013.01); *G06F 3/064* (2013.01); *G06F 3/0619* (2013.01); *G06F 3/0659* (2013.01); *G06F 3/0673* (2013.01); *G06F 11/1048* (2013.01); *G11C 11/161* (2013.01); *G11C 11/1673* (2013.01); *G11C 11/1675* (2013.01); *G11C 29/52* (2013.01); *H03M 13/1575* (2013.01); *H03M 13/6502* (2013.01); *G11C 29/70* (2013.01); *G11C 2029/0411* (2013.01)

(58) Field of Classification Search
CPC ........ G06F 3/061; G06F 3/0619; G06F 3/064; G06F 3/0659; G06F 3/0673; G06F 11/1048; G11C 11/161; G11C 11/1673; G11C 11/1675; G11C 29/52; G11C 29/70; G11C 2029/0411; H03M 13/1575; H03M 13/6502

See application file for complete search history.

(56) References Cited

U.S. PATENT DOCUMENTS 4,531,213 A 7/1985 Scheuneman
5,477,551 A 12/1995 Parks et al.
(Continued)

*Primary Examiner* — Kyle Vallecillo
(74) *Attorney, Agent, or Firm* — F. Chau Associates, LLC

(57) ABSTRACT

A semiconductor memory device includes a memory cell array, a control logic circuit, and an error correction circuit. The control logic circuit generates control signals by decoding a command. The control logic circuit, in a write mode of the semiconductor memory device, controls the error correction circuit to read a first unit of data from a selected sub-page and to generate a first parity data based on one of the first sub unit of data and the second sub unit of data and a main data to be written into the sub-page while generating syndrome data by performing an error correction code decoding on the first unit of data. The error correction circuit, when a first sub unit of data includes at least one error bit, selectively modifies the first parity data based on a data mask signal associated with the main data.

20 Claims, 20 Drawing Sheets

(51) Int. Cl.
    *G11C 29/52*         (2006.01)
    *G11C 11/16*         (2006.01)
    *G06F 11/10*         (2006.01)
    *H03M 13/00*        (2006.01)
    *G11C 29/00*         (2006.01)
    *G11C 29/04*         (2006.01)

(56) References Cited

U.S. PATENT DOCUMENTS

| | | |
|---|---|---|
| 5,541,941 A | 7/1996 | Dell et al. |
| 6,708,258 B1 | 3/2004 | Potter et al. |
| 7,277,996 B2 | 10/2007 | LaBerge et al. |
| 8,006,165 B2 | 8/2011 | Yoshida |
| 8,468,416 B2 | 6/2013 | Gara et al. |
| 8,601,341 B2 | 12/2013 | Pawlowski et al. |
| 9,148,176 B2 | 9/2015 | Zhang et al. |
| 2014/0317470 A1* | 10/2014 | Chung ............... G06F 11/1076 714/764 |
| 2015/0089316 A1* | 3/2015 | Zhang ............... H03M 13/2942 714/755 |
| 2016/0203045 A1* | 7/2016 | Suzuki ............... G06F 11/1068 714/764 |
| 2017/0249155 A1* | 8/2017 | Sundrani ............... G06F 9/4401 |
| 2017/0269997 A1* | 9/2017 | Suzuki ............... G06F 11/1068 |
| 2017/0286218 A1* | 10/2017 | Kim ............... G06F 11/1068 |

\* cited by examiner

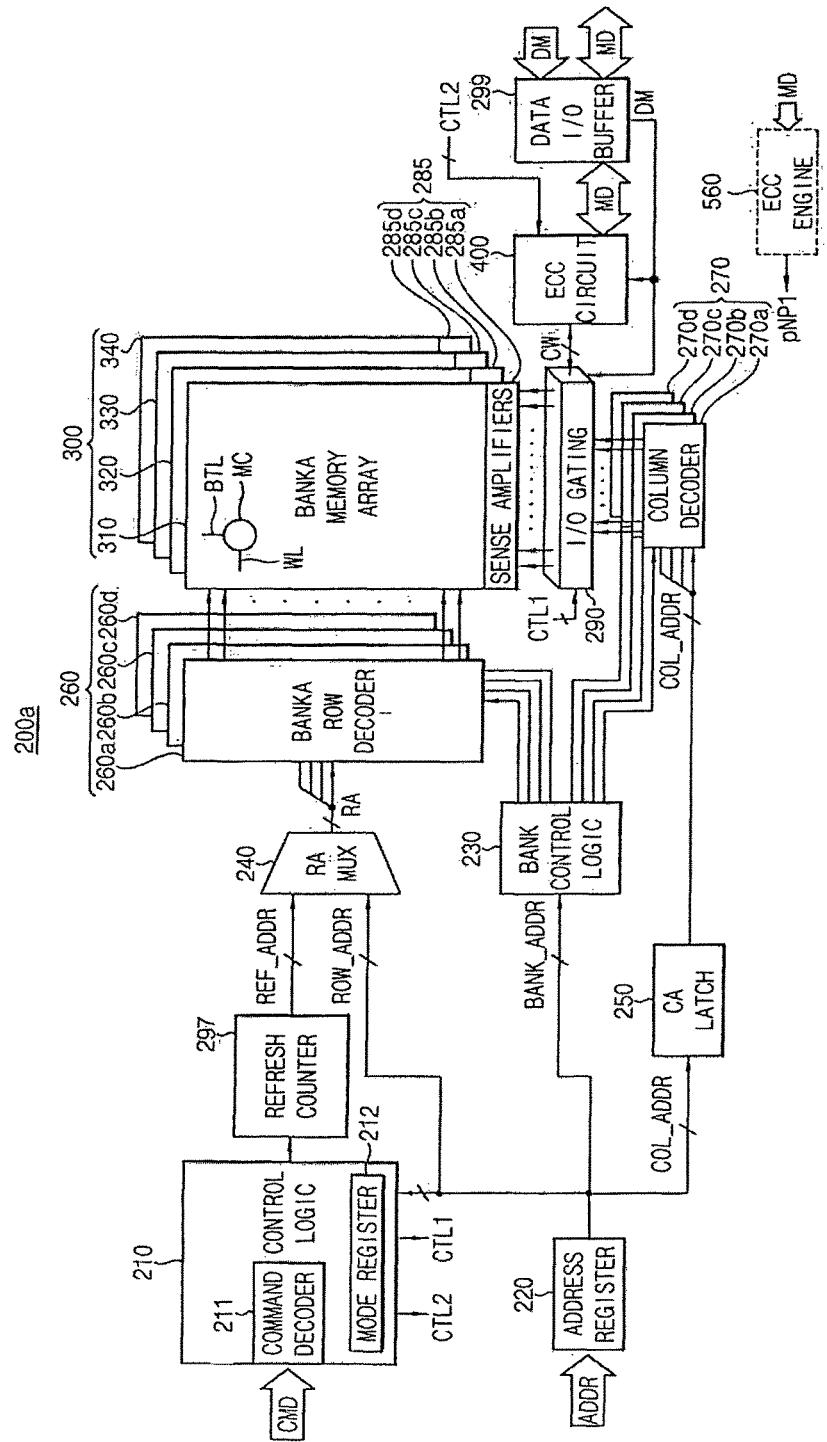

SEMICONDUCTOR MEMORY DEVICES AND METHODS OF OPERATING THE SAME

CROSS-REFERENCE TO RELATED APPLICATIONS

This U.S. application claims priority under 35 USC § 119 to Korean Patent Application No. 10-2016-0050503, filed on Apr. 26, 2016, in the Korean Intellectual Property Office, the disclosure of which is incorporated by reference in its entirety herein.

BACKGROUND

1. Technical Field

The present disclosure relates to memories, and more particularly to semiconductor memory devices and methods of operating the same.

2. Discussion of Related Art

Semiconductor memory devices may be classified into non-volatile memory devices such as flash memory devices and volatile memory devices such as dynamic random access memories (DRAMs). A non-volatile memory device is a type of memory that can retrieve stored information even after power has been interrupted. A volatile memory, however, requires power to maintain the stored information.

DRAMs are typically used as system memories since they operate at high speeds and are low in cost. However, when a DRAM is reduced too greatly in size, bit errors of memory cells in the DRAM may rapidly increase.

SUMMARY

At least one exemplary embodiment of the inventive concept may provide a semiconductor memory device that operates with enhanced performance.

At least one exemplary embodiment of the inventive concept may provide a method of operating a semiconductor memory device with enhanced performance.

A semiconductor memory device according to an exemplary embodiment of the inventive concept includes a memory cell array, a control logic circuit, and an error correction circuit. The memory cell array includes a plurality of bank arrays. The control logic circuit generates control signals by decoding a command from an external memory controller. The control logic circuit, during a write mode of the semiconductor memory device, controls the error correction circuit to read a first unit of data including a first sub unit of data, a second sub unit of data and old parity data from a selected sub page of a plurality of sub pages of a target page in the memory cell array and to generate first parity data based on one of the first sub unit of data and the second sub unit of data and main data to be written in the sub page while generating syndrome data by performing an error correction code (ECC) decoding on the first unit of data. The error correction circuit, when the first sub unit of data includes at least one error bit, selectively modifies the first parity data based on a data mask signal associated with the main data.

According to an exemplary embodiment of the inventive concept, a method of operating a semiconductor memory device including a memory cell array and an error correction circuit is provided. The method includes generating syndrome data based on a first unit of data read from a memory location corresponding to an address received from an external memory controller, which includes a first sub unit of data, a second sub unit of data and old parity data; generating first parity data based on one of the first sub unit of data and the second sub unit of data and main data received from the memory controller; and selectively modifying the first parity data based on the syndrome data and a data mask signal received from the memory controller to generate a second parity data.

Accordingly, while generating syndrome data based on a first unit of data read from a target page in which a main data is to be written by performing an ECC decoding on the first unit of data, first parity data generated based on at least the main data and the first parity data is selectively modified depending on a position of an error bit in the first unit of data. Therefore, a time required for performing a read-modify-write operation may be reduced and errors in a codeword may be prevented.

A semiconductor memory device according to an exemplary embodiment of the inventive concept includes a memory cell array, a control logic circuit, and an error correction circuit. The memory cell array includes a plurality of bank arrays. The control logic circuit is configured to receive a write command and main data from an external memory controller. The control logic circuit is configured to control the ECC to read data from one of the bank arrays corresponding to the main data comprising a first data part, a second data part, and previous parity data. The control logic circuit, when the first data part includes at least one bit error, is configured to maintain the previous parity data when the main data is to be written into a first location in which the first data part is located, and modify the previous parity data using syndrome data when the main data is to be written into a second location in which the second data part is located.

BRIEF DESCRIPTION OF THE DRAWINGS

Exemplary embodiments of the inventive concept will be described below in more detail with reference to the accompanying drawings.

FIG. 3 is a block diagram illustrating the semiconductor memory device shown in FIG. 2, according to an exemplary embodiment of the inventive concept.

DETAILED DESCRIPTION OF THE EXEMPLARY EMBODIMENTS

The inventive concept will be described more fully hereinafter with reference to the accompanying drawings, in which some exemplary embodiments thereof are shown.

Figure 1:
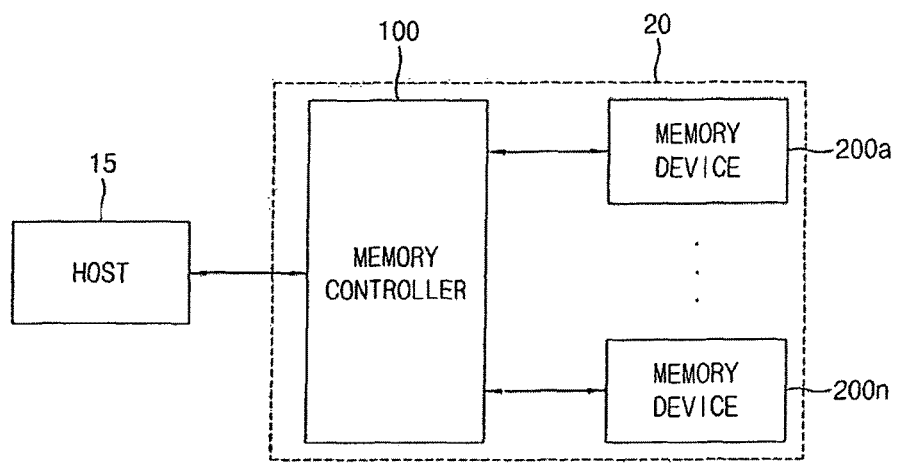
FIG. 1 is a block diagram illustrating an electronic system according to an exemplary embodiment of the inventive concept.

FIG. 1 is a block diagram illustrating an electronic system according to an exemplary embodiment of the inventive concept.

Referring to FIG. 1, an electronic system (or an electronic device) 10 includes a host 15 (e.g., a host device) and a memory system 20. The memory system 20 includes a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control overall operation of the memory system 20. The memory controller 100 may control an overall data exchange between the host 15 and the plurality of semiconductor memory devices 200a~200n. For example, the memory controller 100 may write data into the plurality of semiconductor memory devices 200a~200n or read data from the plurality of semiconductor memory devices 200a~200n in response to request from the host 15. The request may include a read command or a write command, as an example.

In addition, the memory controller 100 may issue operation commands to the plurality of semiconductor memory devices 200a~200n for controlling the plurality of semiconductor memory devices 200a~200n.

In at least one embodiment, each of the plurality of semiconductor memory devices 200a~200n is a memory device including resistive type memory cells such as a magnetoresistive random access memory (MRAM), a resistive random access memory (RRAM), a phase change random access memory (PRAM) and a ferroelectric random access memory (FRAM), etc. In at least one exemplary embodiment, each of the plurality of semiconductor memory devices 200a~200n is a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. In an embodiment, a magnetization direction of one magnetic layer (e.g., a pinned layer) is fixed and a magnetization direction of the other magnetic layer (e.g., a free layer) varies according to a magnetic field generated by a program current.

The magnetic field of the program current may arrange the magnetization directions of the two magnetic layers in parallel or in anti-parallel. In at least one exemplary embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has limited scalability and is sensitive to write disturbances because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using the STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scalability as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

Similar to a DRAM, an MRAM has a low cost and has a high capacity. Similar to a static random access memory (SRAM), an MRAM operates at high speed. Similar to flash memory, an MRAM is nonvolatile.

Figure 2:
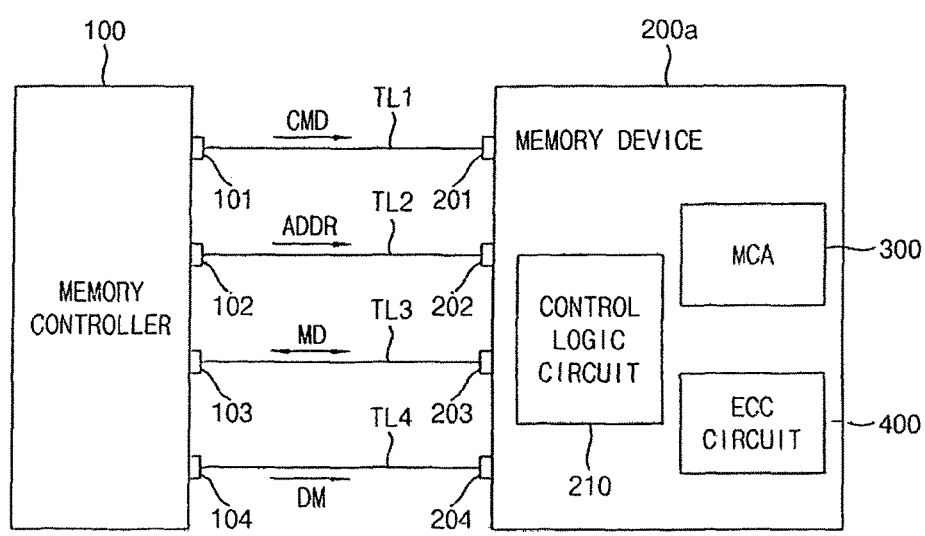
FIG. 2 is a block diagram illustrating the memory system shown in FIG. 1 according to an exemplary embodiment of the inventive concept.

FIG. 2 is a block diagram illustrating the memory system shown in FIG. 1 according to an exemplary embodiment of the inventive concept.

In FIG. 2, only one semiconductor memory device 200a in communication with the memory controller 100 is illustrated for convenience. However, the details discussed herein related to the semiconductor memory device 200a may be applied to the other semiconductor memory devices 200b~200n.

Referring to FIG. 2, the memory system 20 includes the memory controller 100 and the semiconductor memory device 200a. Each of the memory controller 100 and the semiconductor memory device 200a may be formed as a separate semiconductor chip or as a separate group of chips. For example, the memory controller 100 and the semiconductor memory device 200a may be packaged together in stacking form of the semiconductor chips.

The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 may transmit a command signal CMD through a command transmission line TL1, the address pins 102 and 202 may transmit an address signal ADDR through an address transmission line TL2, and the data pins 103 and 203 may exchange main data MD through a data transmission line TL3. The separate pins 104 and 204 may transmit a data mask signal DM through a transmission line TL4. In an embodiment, the semiconductor memory device 200a performs a masked write operation in response to the data mask signal DM. In an exemplary embodiment, the separate pins 104 and 204 and the transmission line TL4 are not included in the memory system 20.

The semiconductor memory device 200a includes a memory cell array (MCA) 300 that stores the main data MD, an error correction circuit (also referred to as an ECC circuit) 400 and a control logic circuit 210 (also referred to as a 'control logic') that controls the error correction circuit 400.

In an exemplary embodiment of the inventive concept, the control logic circuit 210, during a write mode of the semiconductor memory device 200a, controls the error correction circuit 400 to read a first unit of data including a first sub unit of data, a second sub unit of data and old parity data from a selected sub page among a plurality of sub pages of a target page in the memory cell array 300, and to generate first parity data based on one of the first sub unit of data and the second sub unit of data and main data MD to be written into the selected sub page while generating syndrome data by performing an error correction code (ECC) decoding on the first unit of data.

In an embodiment, the error correction circuit 400, when the first sub unit of data includes at least one error bit, selectively modifies the first parity data based on a data mask signal DM associated with the main data MD.

FIG. 3 is a block diagram illustrating the semiconductor memory device shown in FIG. 2, according to an exemplary embodiment of the inventive concept.

Referring to FIG. 3, the semiconductor memory device 200a includes the control logic circuit 210, an address register 220, bank control logic 230, a refresh counter 297, a row address multiplexer (RA MUX 240, a column address (CA) latch 250, a row decoder 260, a column decoder 270, the memory cell array 300, a sense amplifier unit 285, an input/output (I/O) gating circuit 290, the error correction circuit 400, and a data input/output (I/O) buffer 299.

In an exemplary embodiment, the refresh counter 297 is not included in the semiconductor memory device 200a. That is, when the memory cell array 300 is implemented with a plurality of resistive type memory cells, the refresh counter 297 is not included in the semiconductor memory device 200a.

The memory cell array 300 includes first through fourth bank arrays 310~340. The row decoder 260 includes first through fourth bank row decoders 260a~260d respectively coupled to the first through fourth bank arrays 310~340. The column decoder 270 includes first through fourth bank column decoders 270a~270d respectively coupled to the first through fourth bank arrays 310~340. The sense amplifier unit 285 includes first through fourth bank sense amplifiers 285a~285d respectively coupled to the first through fourth bank arrays 310~340. Each of the first through fourth bank arrays 310~340 includes a plurality of memory cells MC, and each of memory cells MC is coupled to a corresponding word-line WL and a corresponding bit-line BTL. The first through fourth bank arrays 310~340, the first through fourth bank row decoders 260a~260d, the first through fourth bank column decoders 270a~270d and first through fourth bank sense amplifiers 285a~280d form first through fourth banks. Although the semiconductor memory device 200a shown in FIG. 3 illustrates four banks, the semiconductor memory device 200a may include a fewer or greater number of banks.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 generates a refresh row address REF_ADDR for refreshing memory cell rows in the memory cell array 300 under control of the control logic circuit 210. The refresh counter 297 may be included when the memory cells MC are implemented with dynamic memory cells.

The row address multiplexer 240 receives the row address ROW_ADDR from the address register 220 and receives the refresh row address REF_ADDR from the refresh counter 297. The row address multiplexer 240 selectively outputs the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d decodes the row address RA that is output from the row address multiplexer 240, and activates a word-line corresponding to the row address RA. For example, the activated bank row decoder may apply a word-line driving voltage to the word-line corresponding to the row address RA.

The column address latch 250 receives the column address COL_ADDR from the address register 220, and temporarily stores the received column address COL_ADDR. In an exemplary embodiment, during a burst mode, the column address latch 250 generates column addresses that increment from the received column address COL_ADDR. The column address latch 250 may apply the temporarily stored or generated column address to the first through fourth bank column decoders 270a~270d. For example, during the burst mode, if the received column address is 0x01, then the column address latch 250 applies 0x01 to the first bank column decoder 270a, increments the column address to 0x02 for application to the second bank column decoder 270b, increments the column address to 0x03 for application to the third bank column decoder 270c, and increments the column address to 0x04 for application to the fourth bank column decoder 270d.

The activated one of the first through fourth bank column decoders 270a~270d decodes the column address COL_ADDR that is output from the column address latch 250, and controls the I/O gating circuit 290 to output data corresponding to the column address COL_ADDR.

The I/O gating circuit 290 may include a circuitry for gating input/output data. The I/O gating circuit 290 may further include input data mask logic, read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. Main data MD to be written into one bank array of the first through fourth bank arrays 310~340 may be provided to the data I/O buffer 299 from the memory controller 100. The main data MD provided to the data I/O buffer 299 may be provided to the error correction circuit 400. The main data MD is encoded by the error correction circuit 400 to generate the codeword CW, and the codeword CW is provided to the I/O gating circuit 290. The write driver may write the codeword CW into one bank array of the first through fourth bank arrays 310~340.

The data I/O buffer 299 may provide the main data MD from the memory controller 100 to the error correction circuit 400 during a write operation and may provide the main data MD from the error correction circuit 400 to the memory controller 100 during a read operation. The data I/O buffer 299 may receive the data mask signal DM from the memory controller 100 and may provide the data mask signal DM to the I/O gating circuit 290.

In an embodiment, the error correction circuit 400, during a write operation, generates parity data based on the main data MD from the data I/O buffer 299, and provides the I/O gating circuit 290 with the codeword CW including the main data MD and the parity data. The I/O gating circuit 290 may write the codeword CW into one bank array.

In an embodiment, the error correction circuit 400, during a write operation, reads a first unit of data including a first sub unit of data, a second sub unit of data and old parity data from a selected sub page among a plurality of sub pages of a target page in the memory cell array 300, and generates first parity data based on one of the first sub unit of data and the second sub unit of data and the main data MD to be written into the selected sub page while generating syndrome data by performing ECC decoding on the first unit of data. In an embodiment, the error correction circuit 400, when the first sub unit of data includes at least one error bit, selectively modifies or corrects the first parity data based on the data mask signal DM associated with the main data MD.

In an embodiment, a size of the first unit of data corresponds to a size of the codeword of the semiconductor memory device 200a, and each size of the first sub unit of data and the second sub unit of data corresponds to a size of a prefetching unit of the semiconductor memory device 200a. The prefetching unit may correspond to an amount of data that is prefetched upon a prediction being made that the data will be needed in the near future.

In an embodiment, the error correction circuit 400, during a read operation, receives the codeword CW, read from one bank array, from the I/O gating circuit 290. The error correction circuit 400 may perform an ECC decoding on the main data MD based on the parity data in the codeword CW, may correct a single bit error in the main data MD and may provide corrected main data to the data I/O buffer 299.

The control logic circuit 210 may control operations of the semiconductor memory device 200a. For example, the control logic circuit 210 may generate control signals for the semiconductor memory device 200a in order to perform a write operation or a read operation. The control logic circuit 210 includes a command decoder 211 that decodes a command CMD received from the memory controller 100 and a mode register 212 that sets an operation mode of the semiconductor memory device 200a. For example, a value stored in the mode register 212 indicates the operation mode.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 generates a first control signal CTL1 to control the I/O gating circuit 290 and a second control signal CTL2 to control the error correction circuit 400.

The error correction circuit 400 may be arranged for each of the plurality of bank arrays 310, 320, 330 and 340. The semiconductor memory device 200a may further include an ECC engine 560 that generates a first partial parity data pNP1 based at least on the main data MD. The ECC engine 560 may be disposed at a peripheral region of the semiconductor memory device 200a and may be shared by the error correction circuit 400.

FIGS. 4A to 4E are circuit diagrams of examples of the memory cell shown in FIG. 3, according to exemplary embodiments of the inventive concept.

Figure 4A:
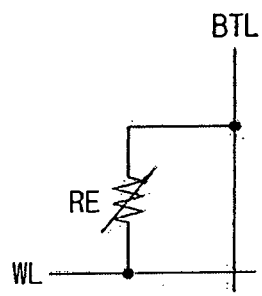
FIGS. 4A to 4E are circuit diagrams of examples of the memory cell shown in FIG. 3, according to an exemplary embodiment of the inventive concept.
Figure 4B:
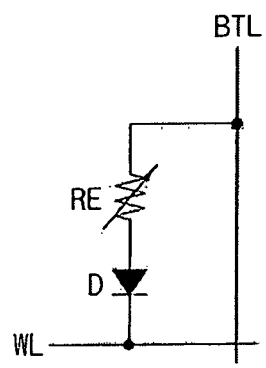
Figure 4C:
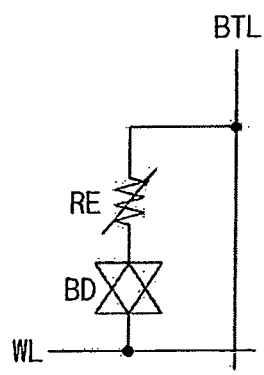
Figure 4D:
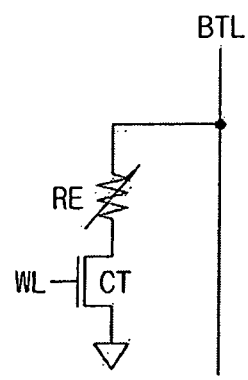
Figure 4E:
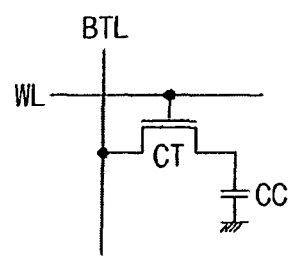

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC includes a resistive element RE connected to a bit-line BTL and a word-line WL. Such a resistive memory cell having a structure without a selection element may store data by a voltage applied between bit-line BL and word-line WL.

Referring to FIG. 4B, a memory cell MC includes a resistive element RE and a diode D. The resistive element RE may include a resistive material for data storage. The diode D may be a selection element (or switching element) that supplies current to the resistive element RE or cuts off the current supply to the resistive element RE according to a bias of word-line WL and bit-line BTL. The diode D is coupled between the resistive element RE and the word-line WL, and the resistive element RE is coupled between the bit-line BTL and the diode D. Positions of the diode D and the resistive element RE may be interchanged. The diode D may be turned on or turned off by a word-line voltage. Thus, a resistive memory cell is not driven when a voltage of a constant level or higher is supplied to an unselected word-line WL.

Referring to FIG. 4C, a memory cell MC includes a resistive element RE and a bidirectional diode BD. The resistive element R includes a resistive material for data storage. The bidirectional diode BD is coupled between the resistive element RE and a word-line WL, and the resistive element RE may be coupled between a bit-line BTL and the bidirectional diode BD. Positions of the bidirectional diode BD and the resistive element RE may be interchanged. The bidirectional diode BD may block leakage current flowing to an unselected semiconductor memory cell.

Referring to FIG. 4D, a memory cell MC includes a resistive element RE and a transistor CT. The transistor CT may be a selection element (or switching element) that supplies current to the resistive element RE or cuts off the current supply to the resistive element RE according to a voltage applied to a word-line WL. The transistor CT is coupled between the resistive element RE and the word-line WL, and the resistive element RE is coupled between a bit-line BTL and the transistor CT. Positions of the transistor CT and the resistive element RE may be interchanged. The semiconductor memory cell may be selected or unselected depending on whether the transistor CT driven by word-line WL is turned on or turned off.

Referring to FIG. 4E, a memory cell MC includes a cell capacitor CC and a transistor CT. The transistor CT may be a selection element (or switching element) that connects/disconnects the cell capacitor CC to/from a bit-line BTL according to a voltage applied to a word-line WL. The transistor CT is coupled between the cell capacitor CC, a word-line WL and a bit-line BTL, and the cell capacitor CC is coupled between the transistor CT and a plate voltage (not illustrated).

Figure 5:
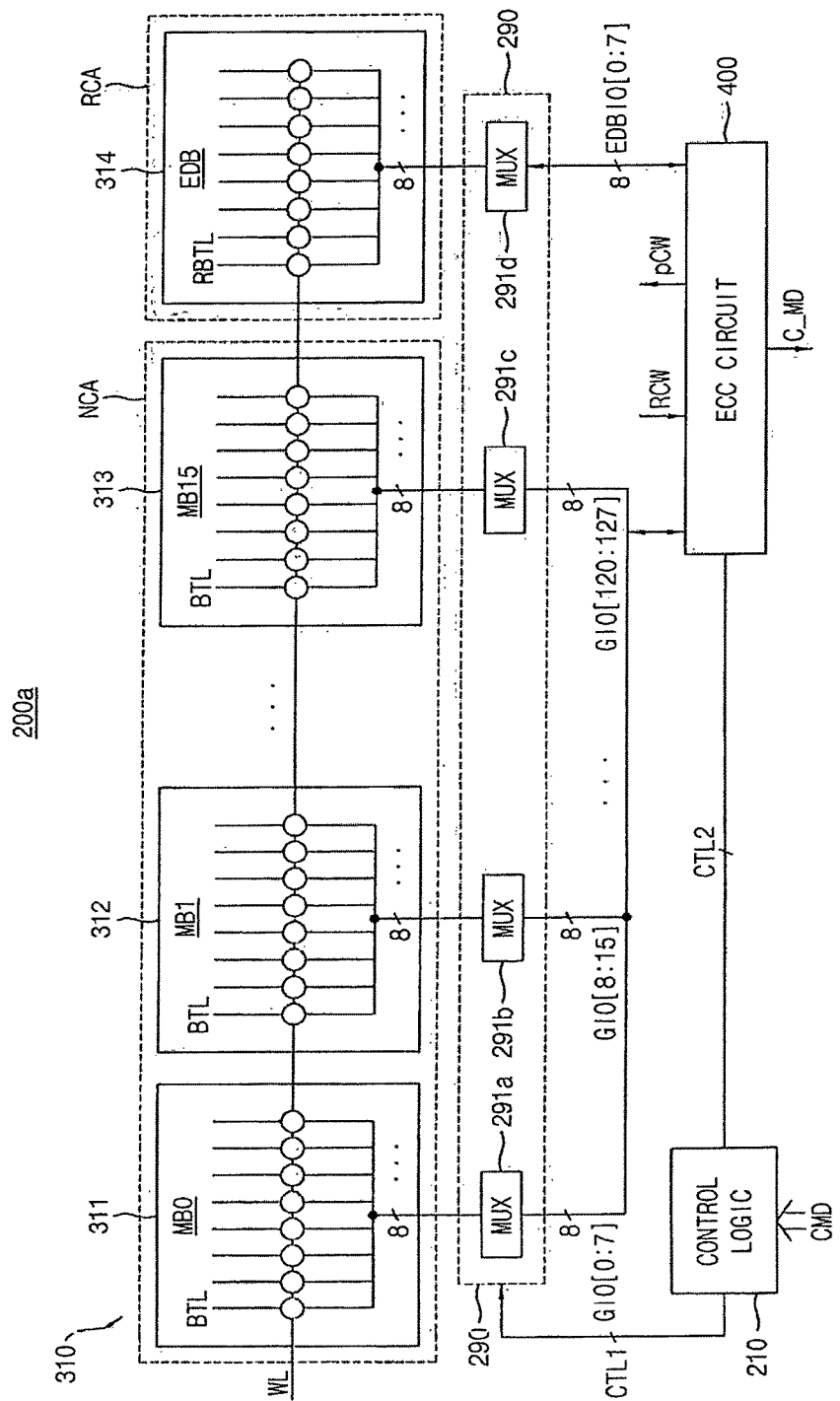
FIG. 5 illustrates a portion of the semiconductor memory device of FIG. 3 in a read operation.

FIG. 5 illustrates a portion of the semiconductor memory device of FIG. 3 during a read operation.

In FIG. 5, the control logic circuit 210, the first bank array 310, the I/O gating circuit 290, and the error correction circuit 400 are illustrated.

Referring to FIG. 5, the first bank array 310 includes a normal cell array NCA and a redundancy cell array RCA. The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200a. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns.

In the first memory blocks 311~313, rows may be formed, for example, of 8K word-lines WL and columns may be formed, for example, of 1K bit-lines BTL. The first memory cells connected to intersections of the word-lines WL and the bit-lines BTL may be dynamic memory cells or resistive type memory cells. In the second memory block 314, rows may be formed, for example, of 8K word-lines WL and columns may be formed, for example, of 1K bit-lines BTL. The second memory cells connected to intersections of the word-lines WL and the bit-lines RBTL may be dynamic memory cells or resistive type memory cells.

The I/O gating circuit 290 includes a plurality of switching circuits 291a~291d respectively connected to the first memory blocks 311~313 and the second memory block 314. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits.

The error correction circuit 400 may be connected to the switching circuits 291a~291d through first data lines GIO[0:127] and second data lines EDBIO[0:7].

The control logic circuit 210 may decode the command CMD to generate the first control signal CTL1 for controlling the switching circuits 291a~291d and the second control signal CTL2 for controlling the error correction circuit 400.

When the command CMD is a read command, the control logic circuit 210 provides the first control signal CTL1 to the I/O gating circuit 290 such that the first unit of a read codeword RCW stored in a sub-page of a page in the first bank array 310 is provided to the error correction circuit 400.

The error correction circuit 400, in response to the second control signal CTL2, performs the read-modify-write operation on the first unit of the read codeword RCW. In an embodiment, the error correction circuit 400 corrects an error bit of a sub unit of data in the read codeword RCW using the parity data in the read codeword RCW, writes back the corrected sub unit of data (e.g., a partial codeword pCW) into a memory location corresponding to the sub unit of data of the sub-page in the first bank array 310, and may provide corrected main data C_MD to the memory controller 100 via the data I/O buffer 299. When the corrected sub unit of data including the error bit is written back into the memory location, power consumption may be greatly reduced when compared with a case in which all data corresponding to the sub-page is written back into a memory location corresponding to the sub-page.

The I/O gating circuit 290 and the error correction circuit 400 may perform the read-modify-write operation sequentially on a plurality of sub-pages in one page of the memory cells in the first bank array 310 under control of the control logic circuit 210.

Figure 6:
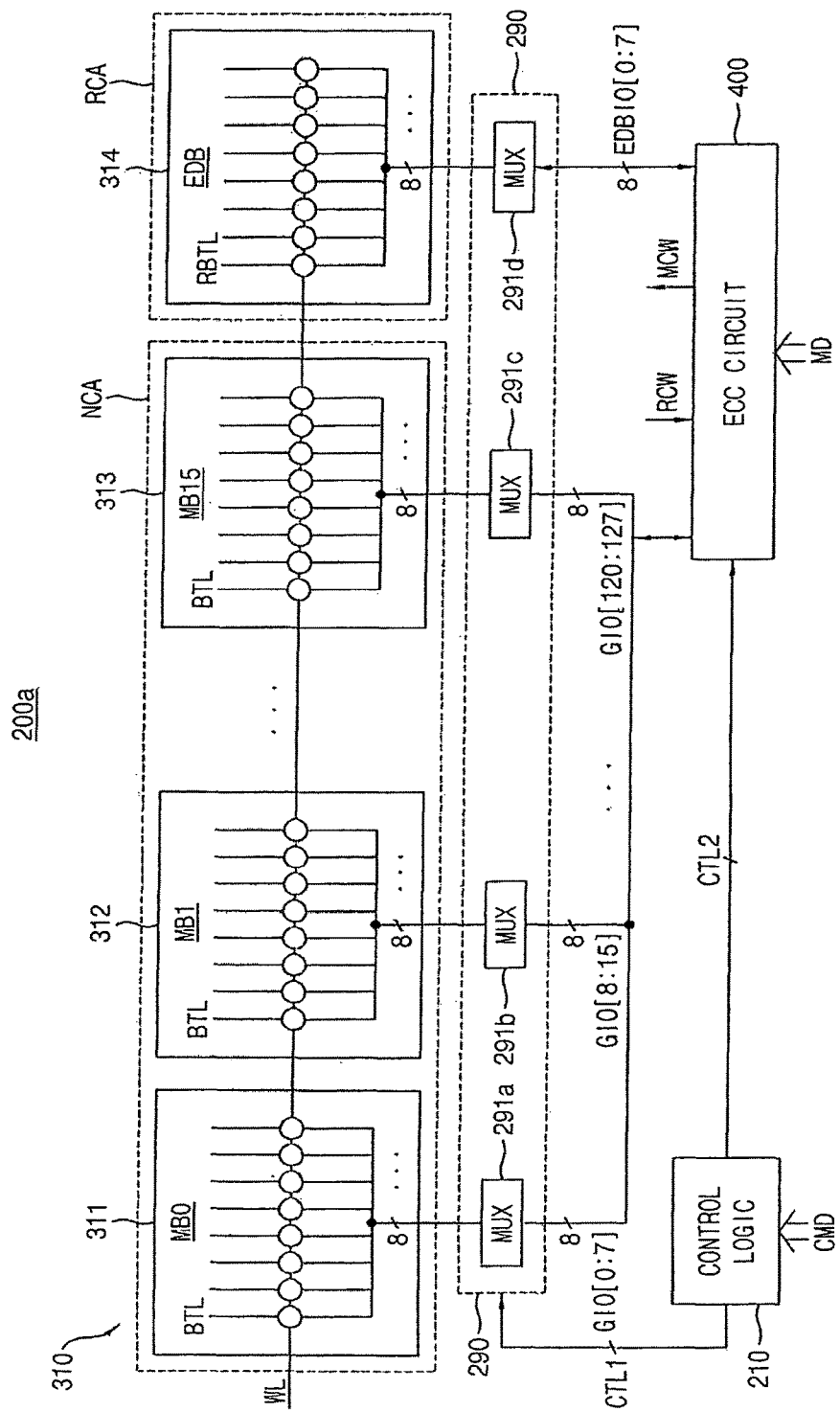
FIG. 6 illustrates a portion of the semiconductor memory device of FIG. 3 in a write operation mode.

FIG. 6 illustrates a portion of the semiconductor memory device of FIG. 3 in a write operation mode.

Referring to FIG. 6, when the command CMD is a write command, the control logic circuit 210 provides the first control signal CTL1 to the I/O gating circuit 290 such that the first unit of a read codeword RCW stored in a sub-page of a page in the first bank array 310 is provided to the error correction circuit 400.

In an embodiment, the error correction circuit 400, in response to the second control signal CTL2, corrects an error bit of a sub unit of data using the parity data, generates write parity data based on the corrected sub unit of data and a write main data MD and provides a modified codeword MCW including the corrected data of the sub unit, the write main data MD and the write parity data. The I/O gating circuit 290 may write the modified codeword MCW into a memory location corresponding to a sub-page of a target page in the first bank array 310. In an exemplary embodiment, when the I/O gating circuit 290 writes the modified codeword MCW into the memory location corresponding to a sub-page of the target page in the first bank array 310, the error correction circuit 400 selectively modifies the parity data depending on whether a memory location including the error bit is the same as a memory location in which the main data MD is to be written.

Figure 7:
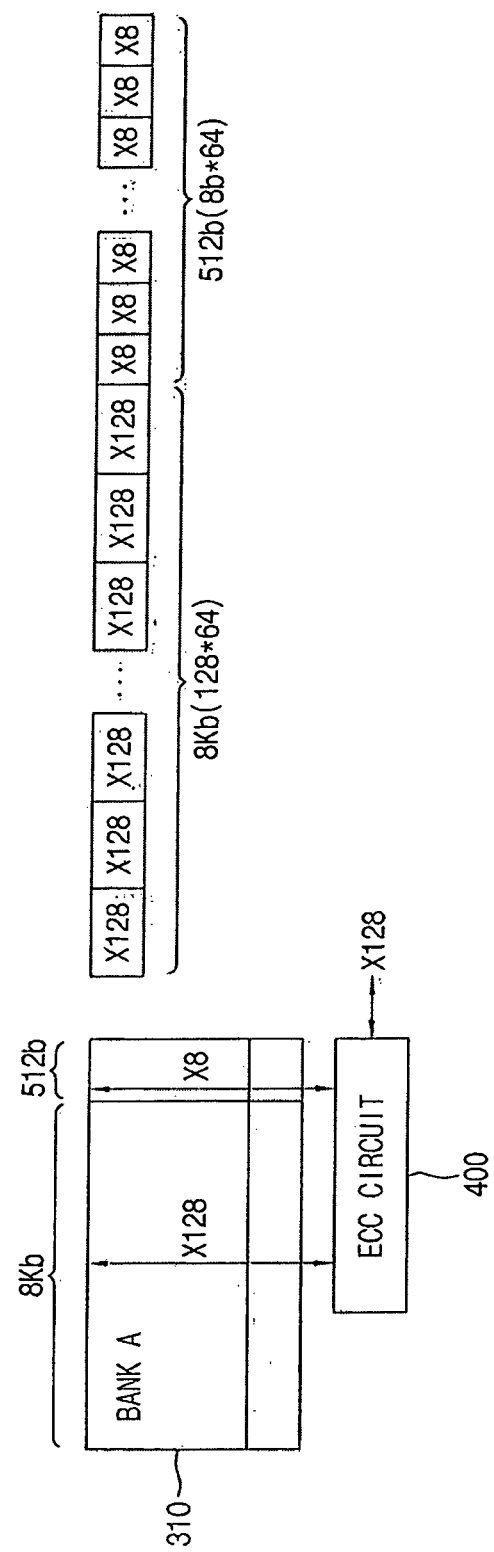
FIG. 7 illustrates a bank array and the error correction circuit shown in the semiconductor memory device of FIG. 3.

FIG. 7 illustrates a bank array and the error correction circuit shown in the semiconductor memory device of FIG. 3.

In FIG. 7, the first bank array 310 is illustrated for convenience, however, the details discussed herein related to the first bank array 310 may be applied to the other bank arrays 320, 330 and 340.

Referring to FIG. 7, each page of the first bank array 310 has a size of 8 Kb and each sub-page of the page has a size of 128 b. A parity data of 8 b is stored for each sub-page. Thus, in this example, the first bank array 310 includes 64 sub-pages and 512 parity bits. Data from each sub-page having a size of 128 b and corresponding parity data having a size of 8 b are sequentially read and provided to the error correction circuit 400. A Hamming code may be used by the error correction circuit 400 for error detection and correction. The ECC method and a codeword length used during read/write operations may also be used for a scrubbing operation according to an exemplary embodiment of the inventive concept. In an embodiment, the scrubbing operation consists of reading data from a memory location, correcting errors in the read data, and writing the corrected data back to the same location. While the above discusses each sub-page having a size of 8 Kb and the parity data having a size of 8 bytes, the inventive concept is not limited thereto. For example, the size of each sub-page may be less than or greater than 8 Kb and the size of the parity data may be less than or greater than 8 bytes.

Figure 8:
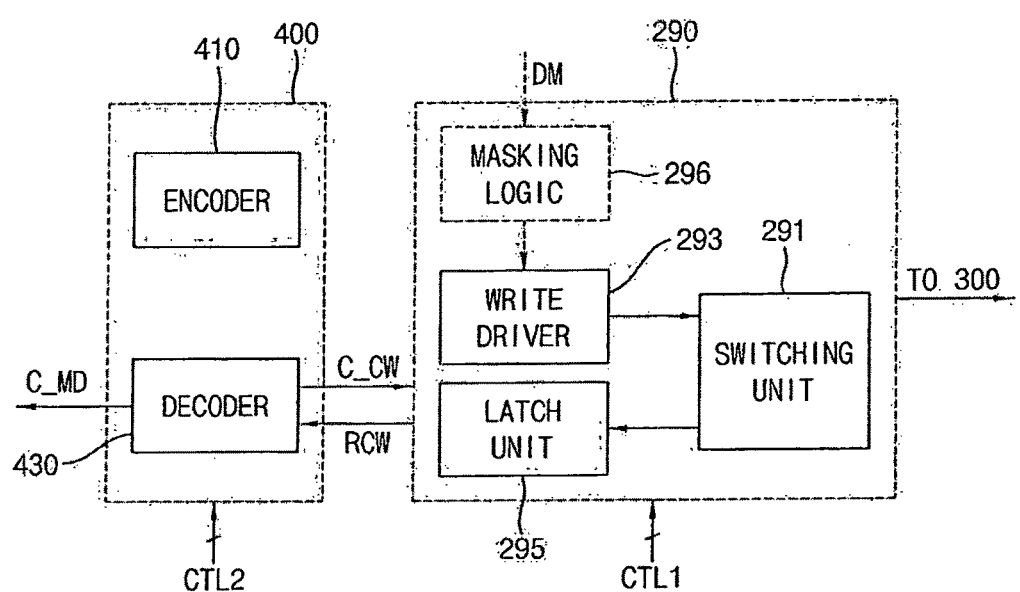
FIG. 8 illustrates the error correction circuit and the I/O gating circuit in the semiconductor memory device of FIG. 3 in a read operation.

FIG. 8 illustrates the error correction circuit and the I/O gating circuit in the semiconductor memory device of FIG. 3 in a read operation.

Referring to FIG. 8, the error correction circuit 400 includes an ECC encoder 410 and an ECC decoder 430. The I/O gating circuit 290 includes a switching unit 291, a write driver 293 and a latch unit 295. The I/O gating circuit 290 may further include masking logic 296. The switching unit 291 may include the switches 291a~291d illustrated in FIGS. 5 and 6. The I/O gating circuit 290 provides the ECC decoder 430 with the read codeword RCW read from a sub-page of a page in the memory cell array 300 during the read operation. In an embodiment, the ECC decoder 430 corrects an error bit in the read codeword RCW using parity data in the read codeword RCW and provides a corrected codeword C_CW to the I/O gating circuit 290. The I/O gating circuit 290 receives the corrected codeword C_CW from the ECC decoder 430 and writes back the corrected data of a sub codeword into a memory location corresponding to the sub codeword in the sub-page. In addition, the error correction circuit 400 may provide the corrected main data C_MD to the data I/O buffer 299.

Figure 9:
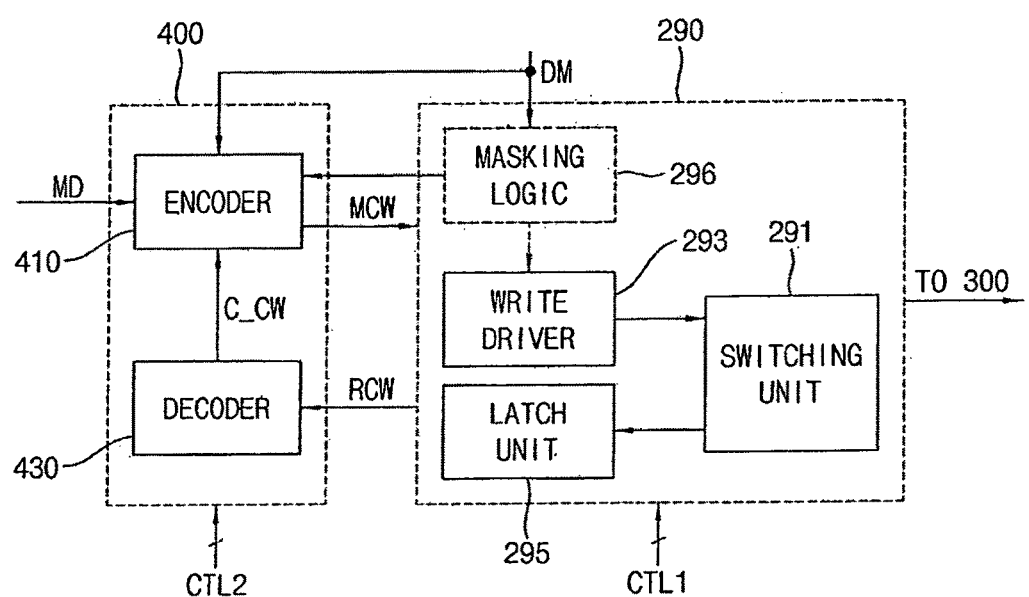
FIG. 9 illustrates the error correction circuit and the I/O gating circuit in the semiconductor memory device of FIG. 3 in a write operation.

FIG. 9 illustrates the error correction circuit and the I/O gating circuit in the semiconductor memory device of FIG. 3 in a write operation.

Referring to FIG. 9, in an exemplary embodiment, during a write operation, the I/O gating circuit 290 provides the ECC decoder 430 with the read codeword RCW read from the sub-page of the page in the memory cell array 300. The ECC decoder 430 may correct an error bit in the read codeword RCW using parity data in the read codeword RCW and provides a corrected codeword C_CW to the ECC encoder 410. The corrected codeword C_CW may correspond to the corrected read codeword RCW. In an embodiment, the ECC encoder 410 generates write parity data based on the corrected codeword C_CW and the write main data MD to generate a modified codeword MCW and provides the modified codeword MCW to the I/O gating circuit 290. The modified codeword MCW may include the write main data MD, the corrected data of the sub unit and the write parity data or the write main data MD, data of the sub unit that did not need to be corrected and the write parity data. The write driver 293 may write the modified codeword MCW into a memory location corresponding to the sub-page of the target page. In an exemplary embodiment, then the I/O gating circuit 290 writes the modified codeword MCW into the memory location corresponding to a sub-page of the target page in the first bank array 310, the error correction circuit 400 selectively modifies the parity data depending on whether a memory location including the error bit is the same as a memory location in which the main data MD is to be written.

The masking logic 296 controls the write driver 293 and the ECC encoder 410 to perform a masked write operation in response to the data mask signal DM from the memory controller 100 during a masked write operation.

Figure 10:
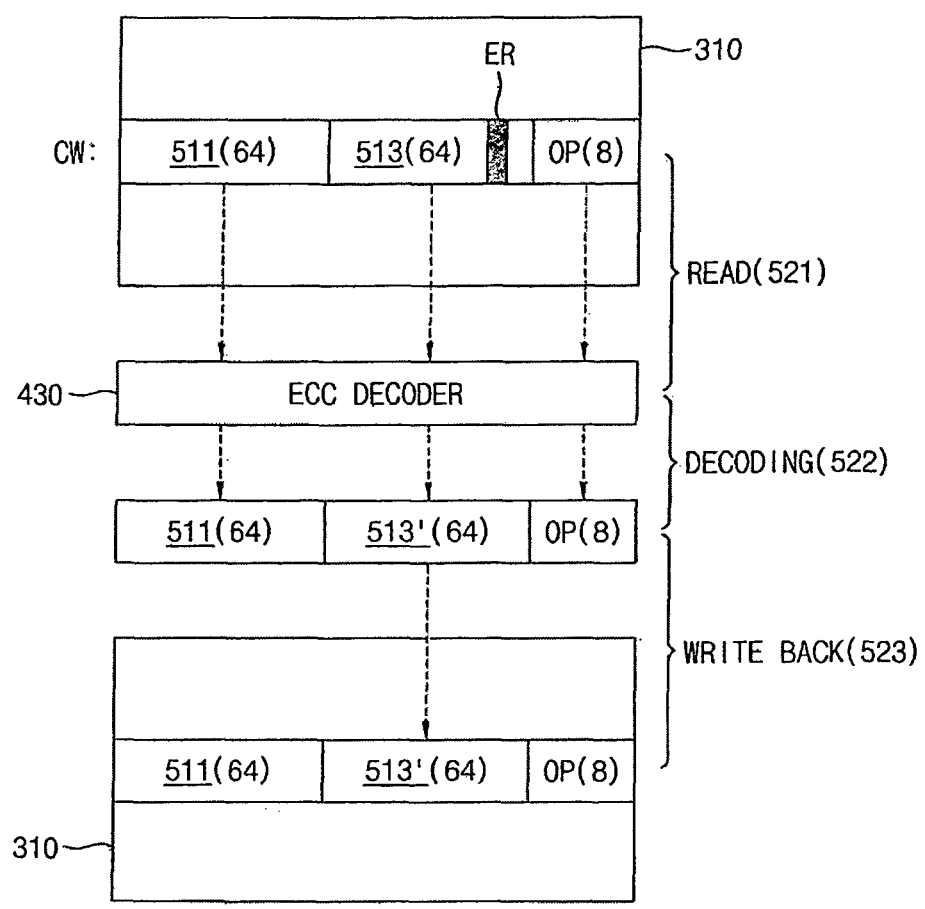
FIG. 10 illustrates that a read operation is performed in the semiconductor memory device of FIG. 5.

FIG. 10 illustrates that a read operation is performed in the semiconductor memory device of FIG. 5.

Referring to FIGS. 5, 7, 8 and 10, when the command CMD is a read command, the first unit of codeword CW including a 64-bit first sub unit of data 511, a 64-bit second sub unit of data 513 and an 8-bit old parity data OP is read from a sub-page of a page in the first bank array 310 and the first unit of codeword CW is provided to the ECC decoder 430 as a reference numeral indicates 521. The second sub unit of data 513 may include an error bit ER. The ECC decoder 430 performs an ECC decoding on the first unit of codeword CW, corrects the error bit ER in the second sub unit of data 513 and provides the corrected second sub unit of data 513' to the I/O gating circuit 290 as a reference numeral indicates 522. The I/O gating circuit 290 writes back the corrected second sub unit of data 513' into a memory location corresponding to the second sub unit 513 of the sub-page as a reference numeral indicates 523 and provides the corrected codeword to the data I/O buffer 299.

The error correction circuit 400 may perform the read-modify-write operation within a column access strobe (CAS)-to-CAS delay time (tCCD) of the semiconductor memory device 200a. The CAS-to-CAS delay time may be the delay time between the time a memory controller tells a memory module to access a particular location, and the time the data from the location is available on output pins of the module.

Figure 11:
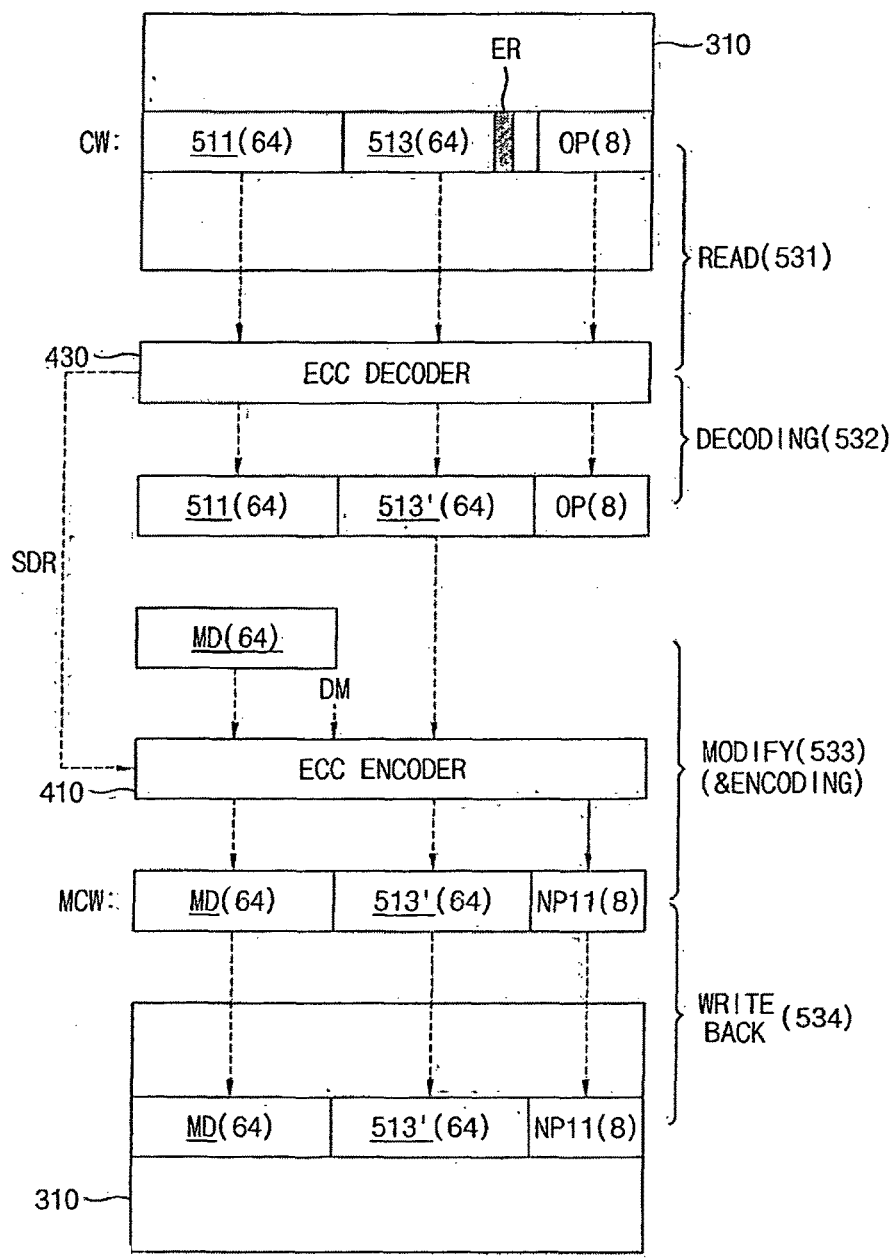
FIG. 11 illustrates that a write operation is performed in the semiconductor memory device of FIG. 6.

FIG. 11 illustrates that a write operation is performed in the semiconductor memory device of FIG. 6.

Referring to FIGS. 6, 7, 9 and 11, when the command CMD is a write command, the first unit of the codeword CW including a 64-bit first sub unit of data 511, a 64-bit second sub unit of data 513 and a 8-bit old parity data OP is read from the sub-page of a page in the first bank array 310 and the first unit of codeword CW is provided to the ECC decoder 430 as a reference numeral indicates 531. The second sub unit of data 513 may include an error bit ER. The ECC decoder 430 performs an ECC decoding on the first unit of codeword CW, corrects the error bit ER in the second sub unit of data 513 and provides the corrected second sub unit of data 513' to the ECC encoder 410 as a reference numeral indicates 532.

The ECC encoder 410 also receives the 64-bit write main data MD and the data mask signal DM, performs an ECC encoding based on the write main data MD the data mask signal DM and the corrected second sub unit of data 513' to generate a new parity data NP11 and provides the I/O gating circuit 290 with a modified codeword MCW including the write main data MD 511, the corrected second sub unit of data 513' and the new parity data NP11 as a reference numeral indicates 533. When the ECC encoder 410 generates the new parity data NP11, the ECC encoder 410 modifies the new parity data NP11 based on syndrome data SDR and the data mask signal DM because a memory location corresponding to the second sub unit 513 is different from a memory location in which the write main data MD is to be written.

The I/O gating circuit 290 may write the write main data MD, the corrected second sub unit of data 513' and the new write parity data NP11 into a memory location corresponding to the sub-page as a reference numeral indicates 534.

Figure 12:
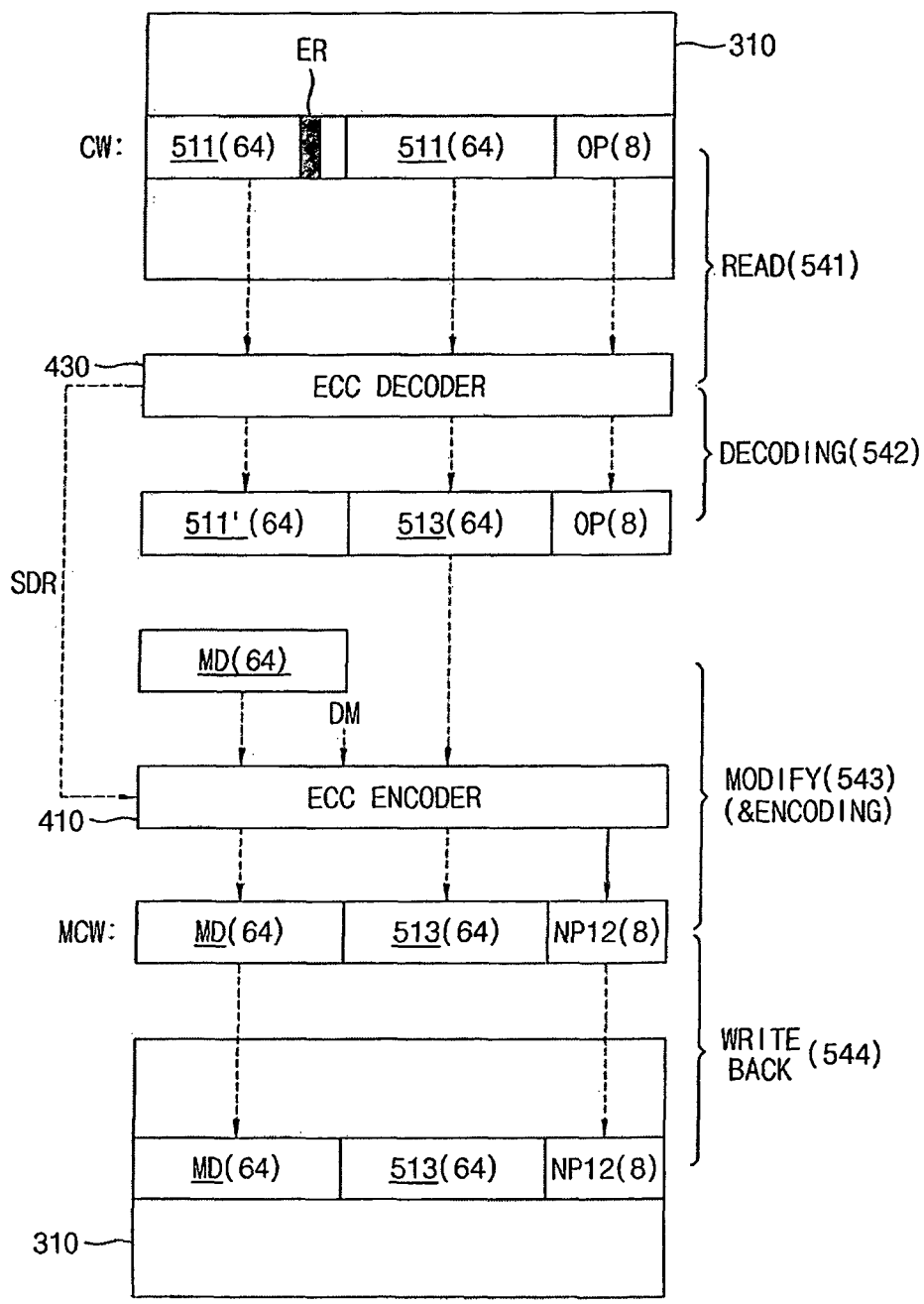
FIG. 12 illustrates that a write operation is performed in the semiconductor memory device of FIG. 6.

FIG. 12 illustrates that a write operation is performed in the semiconductor memory device of FIG. 6.

Referring to FIGS. 6, 7, 9 and 12, when the command CMD is a write command, the first unit of codeword CW including a 64-bit first sub unit of data 511, a 64-bit second sub unit of data 513 and a 8-bit old parity data OP is read from the sub-page of a page in the first bank array 310 and the first unit of codeword CW is provided to the ECC decoder 430 as a reference numeral indicates 541. The first sub unit of data 511 may include an error bit ER. The ECC decoder 430 performs an ECC decoding on the first unit of codeword CW, corrects the error bit ER in the first sub unit of data 511 and provides the corrected first sub unit of data 511' and the second sub unit of data 513 to the ECC encoder 410 as a reference numeral indicates 542.

The ECC encoder 410 also receives the 64-bit write main data MD and the data mask signal DM, performs an ECC encoding based on the write main data MD the data mask signal DM and the second sub unit of data 513 to generate a new parity data NP12 as a reference numeral indicates 543 and provides the I/O gating circuit 290 with a modified codeword MCW including the write main data MD 511, the second sub unit of data 513 and the new parity data NP12. When the ECC encoder 410 generates the new parity data NP12, the ECC encoder 410 maintains the new parity data NP12 because a memory location corresponding to the first sub unit 511 is the same as a memory location in which the write main data MD is to be written.

The I/O gating circuit 290 may write the write main data MD, and the new write parity data NP12 into a memory location corresponding to the sub-page as a reference numeral indicates 544.

Figure 13:
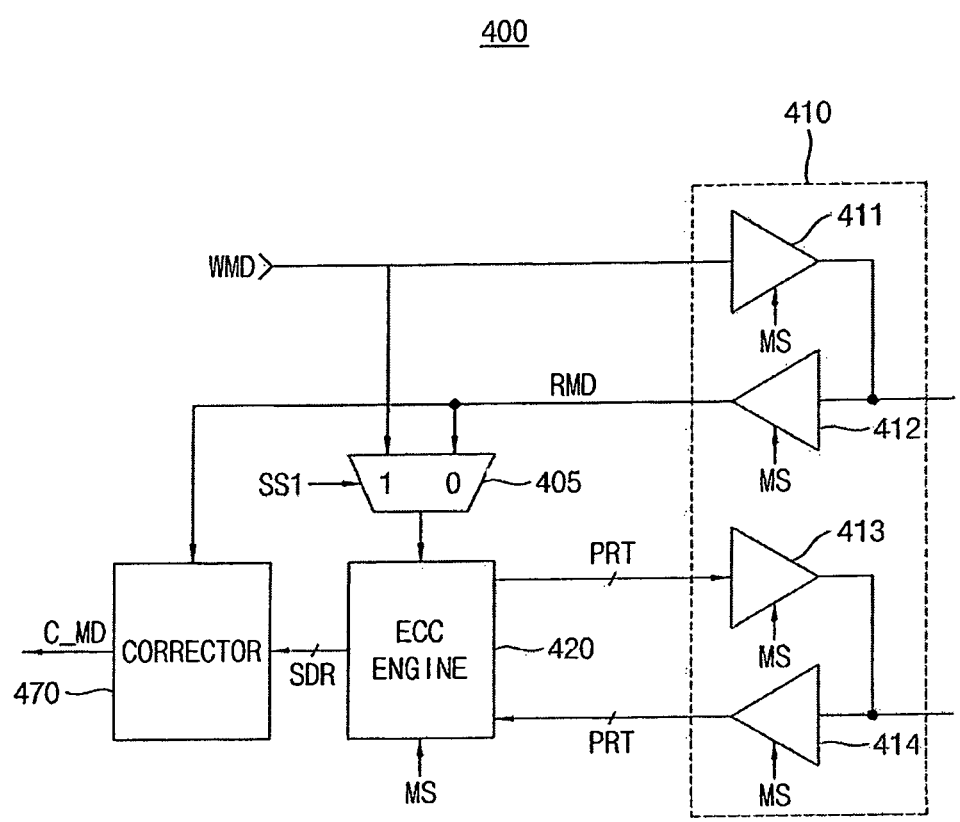
FIG. 13 is a block diagram illustrating the error correction circuit shown in FIG. 3 according to an exemplary embodiment of the inventive concept.

FIG. 13 is a block diagram illustrating the error correction circuit shown in FIG. 3 according to an exemplary embodiment of the inventive concept.

Referring to FIG. 13, the error correction circuit 400 includes a multiplexer 405, an ECC engine 420, a buffer unit 410 and a data corrector 470. The buffer unit 410 may include first through fourth buffers 411~414.

The multiplexer 405, in a write operation of the semiconductor memory device 200a, provides the ECC engine 420 with a write data WMD in response to a first selection signal SS1. The multiplexer 405, in a read operation of the semiconductor memory device 200a, provides the ECC engine 420 with a read data RMD from the buffer 412 in response to the first selection signal SS1. For example, the first selection signal SS1 may be a first logic level during the write operation and a second other logic level during the read operation.

In an embodiment, the buffers 411 and 413 are enabled during the write operation in response to a mode signal MS and provide the write data WMD and the parity data PRT to the I/O gating circuit 290. In an embodiment, the buffers 412 and 414 are enabled during the read operation in response to the mode signal MS, the buffer 412 provides the read data RMD to the multiplexer 410 and the data corrector 470 and the buffer 414 provides the parity data PRT to the ECC engine 420.

In an embodiment, the ECC engine 420, during the write operation, performs an ECC encoding on the write data WMD to provide the parity data PRT to the buffer 413. In an embodiment, the ECC engine 420, during the read operation, performs an ECC decoding on the read data RMD from the multiplexer 405 based on the parity data PRT from the buffer 414 to provide syndrome data SDR to the data corrector 470.

The data corrector 470 corrects an error bit in the read data RMD based on the syndrome data SDR from the ECC engine 420 to provide corrected main data C_MD.

In FIG. 13, the first selection signal SS1 and the mode signal MS may be included in the second control signal CTL2 from the control logic circuit 210 in FIG. 5.

Figure 14:
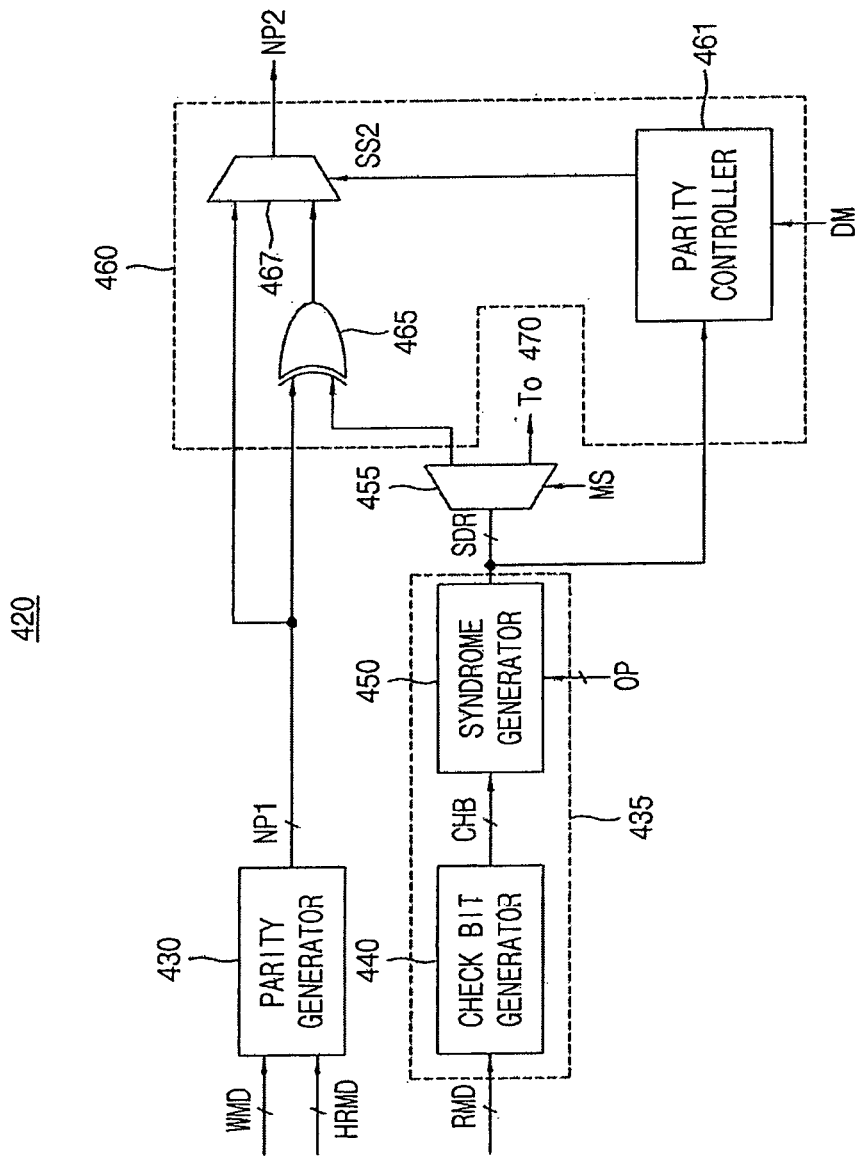
FIG. 14 illustrates the ECC engine in the error correction circuit shown in FIG. 13 according to an exemplary embodiment of the inventive concept.

FIG. 14 illustrates the ECC engine in the error correction circuit shown in FIG. 13 according to an exemplary embodiment of the inventive concept.

Referring to FIG. 14, the ECC engine 420 includes a parity generator 430, a syndrome generation circuit 435, a demultiplexer 455 and a conditional parity correction circuit 460. The syndrome generation circuit 435 includes check bit generator 440 and a syndrome generator 450.

In an embodiment, the parity generator 430 generates first parity data NP1 based on one sub unit HRMD of the first sub unit of data and the second sub unit of data and the main data MD using an array of exclusive OR gates.

While the parity generator 430 generates the first parity data NP1, the syndrome generation circuit 435 performs an ECC decoding on the first unit of data to generate a syndrome data SDR. The check bit generator 440 generates check bits CHB based on the read data RMD. The syndrome generator 450 generates the syndrome data SDR based on the check bits CHB and an old parity data OP provided from the buffer 414.

The demultiplexer 455 provides the syndrome data SDR to one of the data corrector 470 and the conditional parity correction circuit 460 in response to the mode signal MS.

When the mode signal MS indicates a read operation, the demultiplexer 455 provides the syndrome data SDR to the data corrector 470. When the mode signal MS indicates a write operation, the demultiplexer 455 provides the syndrome data SDR to the conditional parity correction circuit 460.

The conditional parity correction circuit 460 receives the syndrome data SDR and the first parity data NP1, and selectively modifies the first parity data NP1 based on the data mask signal DM to generate second parity data NP2.

The conditional parity correction circuit 460 includes a parity controller 461, an exclusive OR gate 465 and a multiplexer 467.

The exclusive OR gate 465 performs an exclusive OR on corresponding bits of the syndrome data SDR and the first parity data NP1 during the write operation or a write mode. The parity controller 461 generates a selection signal SS2 based on a position of the error bit and a memory location in which the main data MD is to be written. The position of the error bit is based on the syndrome data SDR and the memory location is based on the data mask signal DM. The multiplexer 467 outputs one of the first parity data NP1 and an output of the exclusive OR gate 465 as the second parity data NP2, in response to the selection signal SS2.

When the position of the error bit is the same as the memory location in which the write main data WMD is to be written, the parity controller 461 generates the selection signal SS2 such that the multiplexer 467 outputs the first parity data NP1 as the second parity data NP2. For example, when the position of the error bit is the same as the memory location in which the write main data WMD is to be written, the first parity data NP1 output by the parity generator 430 is output as the second parity data NP2.

When the position of the error bit is different from the memory location in which the write main data WMD is to be written, the parity controller 461 generates the selection signal SS2 such that the multiplexer 467 outputs the output of the exclusive OR gate 465 as the second parity data NP2.

Therefore, when the position of the error bit is the same as the memory location in which the write main data WMD is to be written, the first parity data NP1 is maintained. When the position of the error bit is different from the memory location in which the write main data WMD is to be written, the first parity data NP1 may be modified by an exclusive OR operation being performed on the first parity data NP1 and the syndrome data SDR.

While the second parity data NP2 is generated and written into the target page of the memory cell array 300, the write data WMD is also written into the target page of the memory cell array 300.

The error correction circuit 400 may perform the read-modify-write operation which includes reading of the first unit of data, correction of the error bit and writing the main data WMD within tCCD of the semiconductor memory device 200a.

Figure 15:
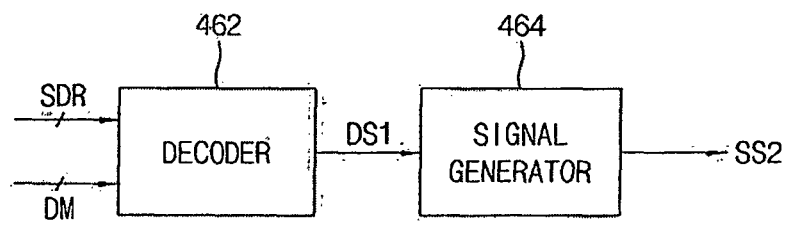
FIG. 15 is a block diagram illustrating the parity controller in the ECC engine of FIG. 14 according to an exemplary embodiment of the inventive concept.

FIG. 15 is a block diagram illustrating the parity controller in the ECC engine of FIG. 14 according to an exemplary embodiment of the inventive concept.

Referring to FIG. 15, the parity controller 461 includes a decoder 462 and a signal generator 464.

The decoder 462 decodes the syndrome data SDR and the data mask signal DM to output a decoding signal DS1 indicating whether the position of the error bit is the same as the memory location in which the main data WMD is to be written. The signal generator 464 generates the selection signal SS2 in response to the decoding signal DS1.

Figure 16:
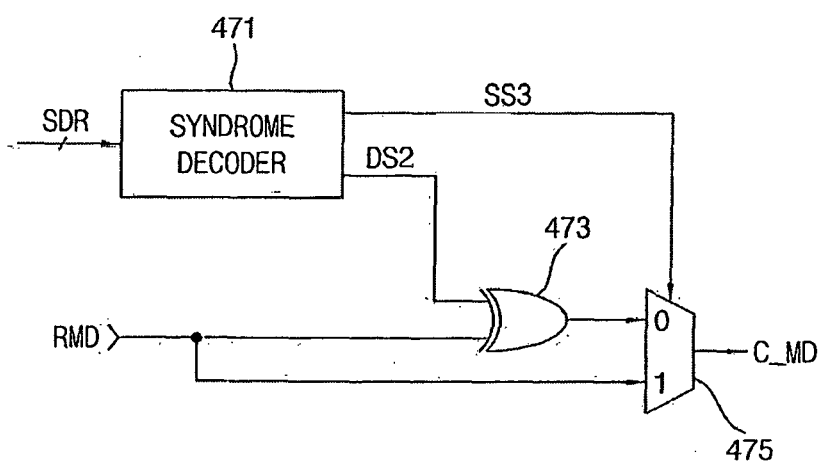
FIG. 16 illustrates the data corrector in the error correction circuit of FIG. 13 according to an exemplary embodiment of the inventive concept.

FIG. 16 illustrates the data corrector in the error correction circuit of FIG. 13 according to an exemplary embodiment of the inventive concept.

Referring to FIG. 16, the data corrector 470 includes a syndrome decoder 471, a bit inverter 473 and a selection circuit 475 which is implemented by a multiplexer.

The syndrome decoder 471 decodes the syndrome data SDR to generate a decoding signal DS2 and a selection signal SS3. The decoding signal DS indicates a position of the at least one error bit. A logic level of the second selection signal SS3 depends on a number of the at least one error bit. For example, if the number of error bits exceeds a threshold value, the logic level is a first value and otherwise the logic level is set to a second other value. The bit inverter 473 inverts the at least one error bit in response to the decoding signal DS2. The selection circuit 475 selects one of the read data RMD and an output of the bit inverter 473 to provide the corrected main data C_MD in response to the second selection signal SS3.

The syndrome decoder 471 outputs the selection signal SS3 with a first logic level when a number of the at least one error bit in the read data RMD exceeds the error correction capability of the ECC based on the syndrome data SDR. The selection circuit 475 provides the read data RMD as the corrected main data C_MD in response to the selection signal SS3 being set to the first logic level. The syndrome decoder 471 outputs the decoding signal DS2 with a first logic level and outputs the selection signal SS3 with a second logic level when a number of the at least one error bit in the read data RMD is within the error correction capability of the ECC based on the syndrome data SDR. The bit inverter 473 inverts the at least one error bit in response to the decoding signal DS2 having a first logic level. The selection circuit 475 provides the output of the bit inverter 473 as the corrected main data C_MD in response to the selection signal SS3 having a second logic level.

Figure 17:
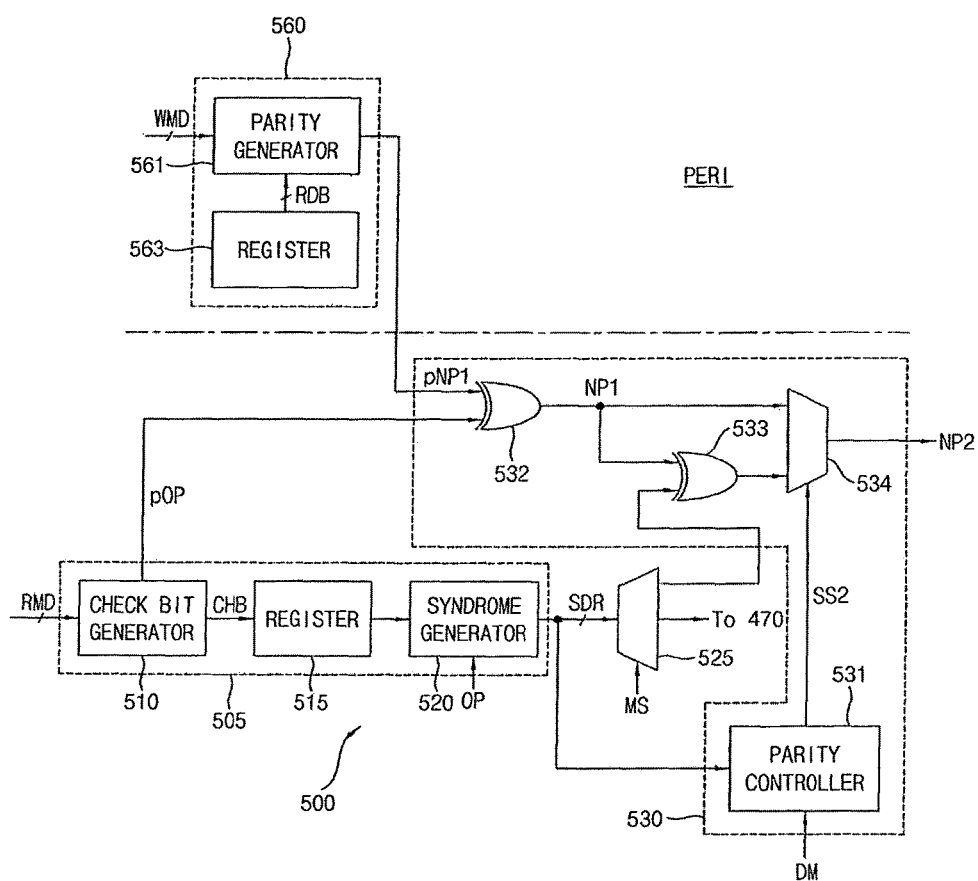
FIG. 17 illustrates an error correction circuit and an ECC engine according to an exemplary embodiment of the inventive concept.

FIG. 17 illustrates an error correction circuit and an ECC engine according to an exemplary embodiment of the inventive concept.

In FIG. 17, an error correction circuit 500 replaces the error correction circuit 400 in FIG. 4. An ECC engine 560 is disposed in a peripheral region PERI of the semiconductor memory device 200a.

Referring to FIG. 17, the ECC engine 560 includes a parity generator 561 and a register 563. The register 563 stores reset data bits RDB. The parity generator 561 generates a first partial parity data pNP1 based on the write data WMD and the reset data bits RDB.

The error correction circuit 500 includes a syndrome generation circuit 505, a demultiplexer 525 and a conditional parity correction circuit 530. The syndrome generation circuit 505 includes check bit generator 510, a register 515 and a syndrome generator 520.

The demultiplexer 525 provides the syndrome data SDR to one of the data corrector 470 and the conditional parity correction circuit 530 in response to the mode signal MS. When the mode signal MS indicates a read operation, the demultiplexer 525 provides the syndrome data SDR to the data corrector 470. When the mode signal MS indicates a write operation, the demultiplexer 525 provides the syndrome data SDR to the conditional parity correction circuit 530.

While the ECC engine 560 generates the first partial parity data pNP1, the syndrome generation circuit 505 performs an ECC decoding on the first unit of data to generate a second partial parity data pOP based on the syndrome data SDR and a portion of the first unit of data. The check bit generator 510 generates check bits CHB based on the read data RMD and generates the second partial parity data pOP based on a portion of the read data RMD. The register 515 may store the check bits CHB. The syndrome generator 520 generates the syndrome data SDR based on the check bits CHB and an old parity data OP provided from the buffer 414.

The conditional parity correction circuit 530 receives the first partial parity data pNP1 and the second partial parity data pOP, and selectively modifies the first parity data NP1 based on the data mask signal DM to generate a second parity data NP2. The first parity data NP1 may be generated based on the first partial parity data pNP1 and the second partial parity data pOP.

The conditional parity correction circuit 530 includes a parity controller 531, a first exclusive OR gate 532, a second exclusive OR gate 533 and a multiplexer 534.

The first exclusive OR gate 532 performs an exclusive OR on corresponding bits of the first partial parity data pNP1 and the second partial parity data pOP during the write operation to generate the first parity data NP1.

The second exclusive OR gate 533 performs an exclusive OR on corresponding bits of the syndrome data SDR and the first parity data NP1 during the write operation or a write mode. The parity controller 531 generates a selection signal SS2 based on a position of the error bit and a memory location in which the main data MD is to be written. The position of the error bit is based on the syndrome data SDR and the memory location is based on the data mask signal DM. The multiplexer 534 outputs one of the first parity data NP1 and an output of the second exclusive OR gate 533 as the second parity data NP2, in response to the selection signal SS2.

When the position of the error bit is the same as the memory location in which the write data WMD is to be written, the parity controller 531 generates the selection signal SS2 such that the multiplexer 534 outputs the first parity data NP1 as the second parity data NP2. When the position of the error bit is different from the memory location in which the write data WMD is to be written, the parity controller 461 generates the selection signal SS2 such that the multiplexer 534 outputs the output of the second exclusive OR gate 533 as the second parity data NP2.

Therefore, when the position of the error bit is the same as the memory location in which the write main data WMD is to be written, the first parity data NP1 is maintained. When the position of the error bit is different from the memory location in which the write main data WMD is to be written, the first parity data NP1 may be modified by an exclusive OR operation being performed on the first parity data NP1 and the syndrome data SDR.

While the second parity data NP2 is generated and written into the target page of the memory cell array 300, the write data WMD is also written into the target page of the memory cell array 300.

The error correction circuit 500 and the ECC engine 560 may perform the read-modify-write operation which includes reading of the first unit of data, correction of the error bit and writing the main data WMD within tCCD of the semiconductor memory device 200a.

As described with reference to FIG. 3, the error correction circuit 500 may be arranged for each of the bank arrays 310, 320, 330 and 340. The ECC engine 560 may be disposed in the peripheral region PERI of the semiconductor memory device 200a and may be shared by the error correction circuit 500.

Figure 18:
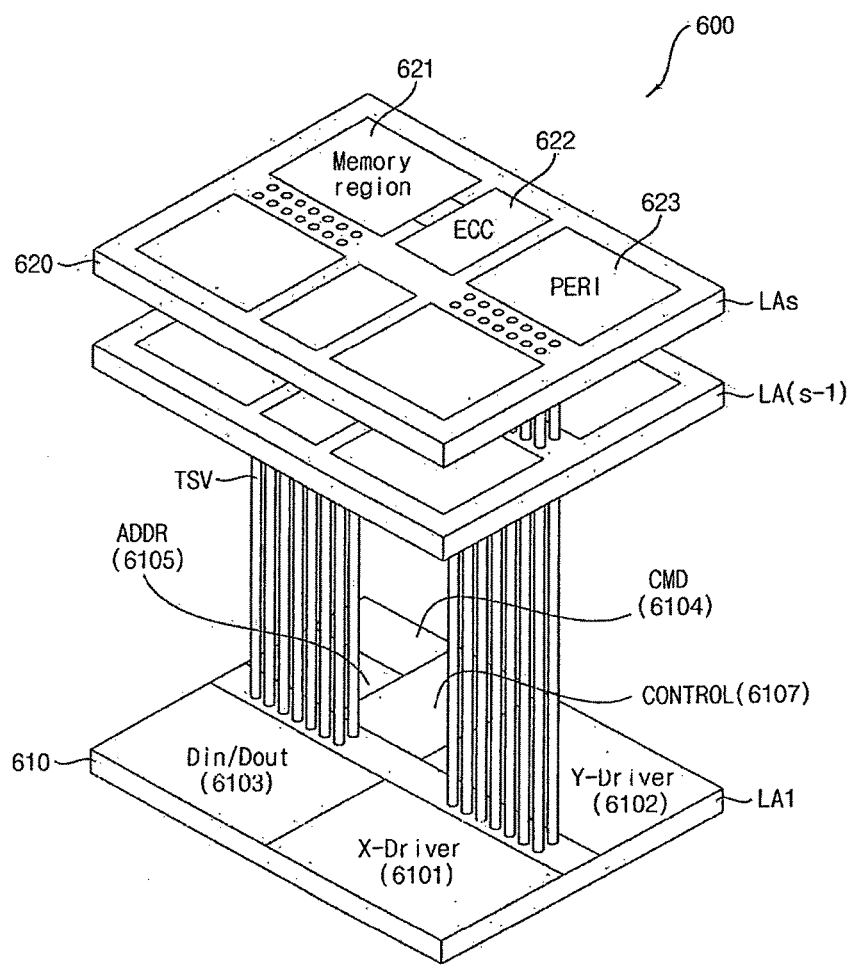
FIG. 18 is a structural diagram illustrating a semiconductor memory device according to an exemplary embodiment of the inventive concept.

FIG. 18 is a structural diagram illustrating a semiconductor memory device according to an exemplary embodiment of the inventive concept.

Referring to FIG. 18, a semiconductor memory device 600 include first through s-th semiconductor integrated circuit layers LA1 through Las (s is an integer equal to or greater than three), in which the lowest first semiconductor integrated circuit layer LA1 is assumed to be an interface or control chip and the other semiconductor integrated circuit layers LA2 through LAs are assumed to be slave chips including core memory chips. The first through s-th semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAs or 620 as the slave chip.

The first semiconductor integrated circuit layer 610 may include various peripheral circuits for driving memory regions 621 provided in the s-th semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged as described with reference to FIG. 3.

The first semiconductor integrated circuit layer 610 may further include a control logic (circuit) 6107. The control logic 6107 may access the memory region 621 and may generate control signals for accessing the memory region 621 based on the command from the memory controller.

The s-th semiconductor integrated circuit layer 620 may include an error correction circuit 622 that performs an ECC encoding on data to be stored in the memory region 621 and performs an ECC decoding on data read from the memory region 621. In an embodiment, the error correction circuit 622, during a write operation, reads a first unit of data including a first sub unit of data, a second sub unit of data and old parity data from a selected sub page of a plurality of sub pages of a target page in the memory region 621, and generates a first parity data based on one of the first sub unit of data and the second sub unit of data and a main data to be written into the sub page while generating syndrome data by performing an ECC decoding on the first unit of data. In addition, when the first sub unit of data includes at least one error bit, the error correction circuit 622 selectively modifies the first parity data using the syndrome data based on a data mask signal associated with the main data.

The s-th semiconductor integrated circuit layer 620 may further include a peripheral region 623 in which an ECC engine is disposed. The ECC engine may generate a first partial parity data at least based on the write data.

In addition, a three dimensional (3D) memory array is provided in semiconductor memory device 600. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 19:
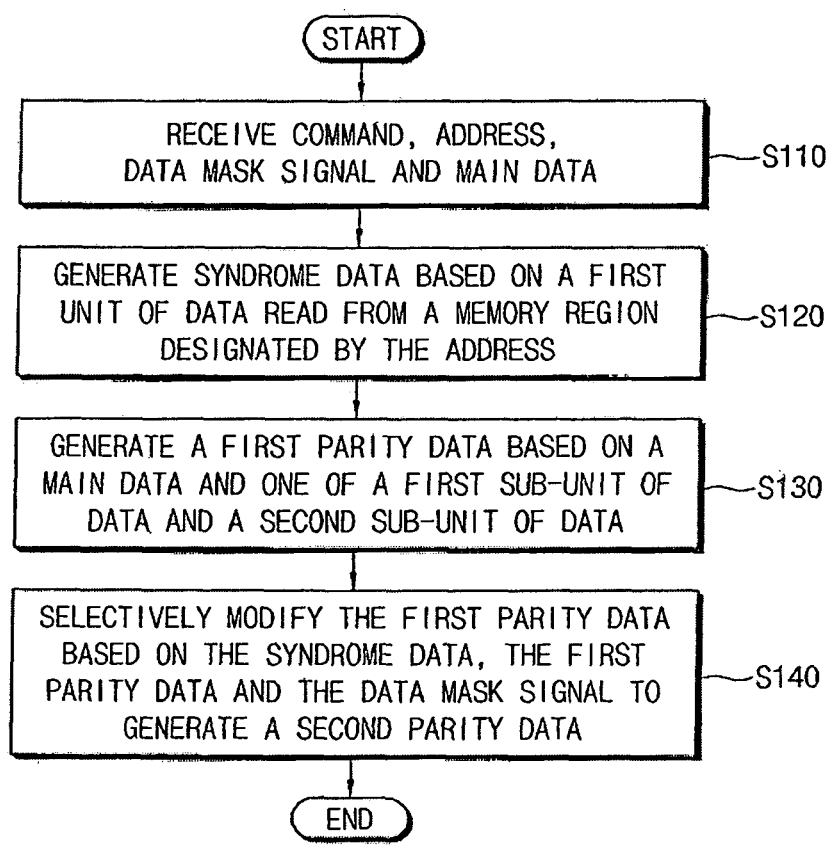
FIG. 19 is a flow chart illustrating a method of operating a semiconductor memory device according to an exemplary embodiment of the inventive concept.

FIG. 19 is a flow chart illustrating a method of operating a semiconductor memory device according to an exemplary embodiment of the inventive concept.

Referring to FIGS. 2, 3 and 13 through 19, in a method of operating a semiconductor memory device 200a including a memory cell array 300 and an error correction circuit 400, the semiconductor memory device 200a receives a command CMD, an address ADDR, a data mask signal DM and a main data MD from an external memory controller 100 (S110). The error correction circuit 400 reads a first unit of data corresponding to the address ADDR from a memory location corresponding to the address ADDR and generates a syndrome data SDR based on the read first unit of data (S120). The first unit of data includes a first sub unit of data, a second sub unit of data and old parity data. The error correction circuit 400 generates first parity data NP1 based on one of the first sub unit of data and the second sub unit of data and the main data MD (S130). The error correction circuit 400 selectively modifies the first parity data NP1 based on the syndrome data SDR and the data mask signal DM to generate second parity data NP2 (S140).

Figure 20:
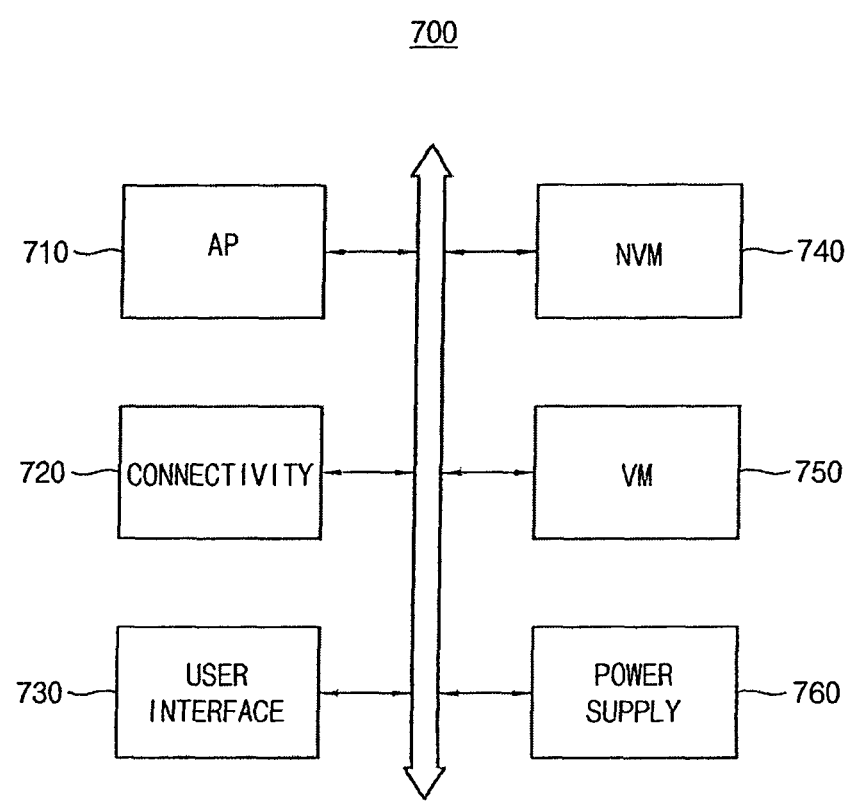
FIG. 20 is a block diagram illustrating a mobile system including the semiconductor memory device according to an exemplary embodiment of the inventive concept.

FIG. 20 is a block diagram illustrating a mobile system including a semiconductor memory device according to an exemplary embodiment of the inventive concept.

Referring to FIG. 20, a mobile system 700 includes an application processor 710, a connectivity unit 720, a user interface 730, a nonvolatile memory device 740, a volatile memory device 750 and a power supply 760.

The application processor 710 may execute applications, such as a web browser, a game application, a video player, etc. The connectivity unit 720 may perform wired or wireless communication with an external device. For example, the connectivity unit 720 may include a transceiver that enables the unit transmit and receive data wirelessly or a network card that enables the unit to exchange data in a wired fashion over a network.

The volatile memory device 750 may store data processed by the application processor 710 or operate as a working memory. The volatile memory device 750 may employ the semiconductor memory device 200a of FIG. 3. Therefore, the volatile memory device 750 may include an error correction circuit that selectively modifies a parity data. Accordingly, the volatile memory device 750 may operate with enhanced performance.

The nonvolatile memory device 740 may store a boot image for booting the mobile system 700. For example, the boot image may correspond to an operating system of the mobile system 700. The user interface 730 may include at least one input device, such as a keypad, a touch screen, etc., and at least one output device, such as a speaker, a display device, etc. The power supply 760 may supply a power supply voltage to the mobile system 700.

Embodiments or aspects of the present inventive concept may be applied to systems using semiconductor memory devices. For example embodiments or aspects of the present inventive concept may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A semiconductor memory device comprising:
   a memory cell array including a plurality of bank arrays;
   a control logic circuit configured to generate control signals by decoding a command from an external memory controller; and
   an error correction circuit,
   wherein the control logic circuit, during a write mode of the semiconductor memory device, is configured to control the error correction circuit to:
   read a first unit of data from a selected sub page of a plurality of sub pages of a target page in the memory cell array, wherein the first unit of data comprises a first sub unit of data, a second sub unit of data and old parity data; and
   generate first parity data based on one of the first sub unit of data and the second sub unit of data and main data to be written in the selected sub page while generating syndrome data by performing an error correction code (ECC) decoding on the first unit of data, and
   wherein the error correction circuit, when the first sub unit of data includes at least one error bit, is configured to perform a selective modification on the first parity data based on a data mask signal associated with the main data,
   wherein the selective modification comprises:
   maintaining the first parity data when the main data is to be written into a memory location in which the first sub unit of data is stored; and
   modifying the first parity data based on the syndrome data when the main data is to be written into a memory location in which the second sub unit of data is stored.

2. The semiconductor memory device of claim 1, wherein the error correction circuit is configured to perform a read operation on the first unit of data to correct the error bit and to perform a write operation on the main data within a column access strobe to column access strobe command delay time of the semiconductor memory device.

3. The semiconductor memory device of claim 1, wherein the error correction circuit comprises:
- a syndrome generation circuit configured to generate the syndrome data by performing the ECC decoding on the first unit of data;
- a parity generator configured to generate the first parity data based on one of the first sub unit of data and the second sub unit of data and the main data; and
- a conditional parity correction circuit configured to receive the syndrome data and the first parity data, and configured to selectively modify the first parity data based on the data mask signal to generate a second parity data.

4. The semiconductor memory device of claim 3, wherein the syndrome generation circuit comprises:
- a check bit generator configured to generate check bits based on the first sub unit of data and the second sub unit of data; and
- a syndrome generator configured to generate the syndrome data based on the check bits and the old parity data.

5. The semiconductor memory device of claim 3, wherein the conditional parity correction circuit comprises:
- an exclusive OR gate configured to perform an exclusive OR on corresponding bits of the syndrome data and the first parity data during the write mode of the semiconductor memory device;
- a parity controller configured to generate a selection signal based on a position of the error bit and a memory location in which the main data is to be written, wherein the position of the error bit is based on the syndrome data and the memory location is based on the data mask signal; and
- a multiplexer configured to output one of the first parity data and an output of the exclusive OR gate as the second parity data, in response to the selection signal.

6. The semiconductor memory device of claim 5, wherein when the position of the error bit is the same as the memory location in which the main data is to be written, the parity controller is configured to generate the selection signal such that the multiplexer outputs the first parity data as the second parity data.

7. The semiconductor memory device of claim 5, wherein when the position of the error bit is different from the memory location in which the main data is to be written, the parity controller is configured to generate the selection signal such that the multiplexer outputs the output of the exclusive OR gate as the second parity data.

8. The semiconductor memory device of claim 5, wherein the parity controller comprises:
- a decoder configured to decode the syndrome data and the data mask signal to output a decoding signal indicating whether the position of the error bit is the same as the memory location in which the main data is to be written; and
- a signal generator configured to generate the selection signal based on the decoding signal.

9. The semiconductor memory device of claim 1, further comprising:
- an ECC engine configured to generate a first partial parity data at least based on the main data, and
- wherein the error correction circuit is configured to selectively determine whether to modify the first parity data further based on the first partial parity data.

10. The semiconductor memory device of claim 9, wherein the error correction circuit comprises:
- a syndrome generation circuit configured to generate the syndrome data by performing the ECC decoding on the first unit of data and configured to generate a second partial parity data based on a portion of the first unit of data; and
- a conditional parity correction circuit configured to receive the syndrome data, the first partial parity data and the second partial parity data, and configured to selectively modify the first parity data based on the data mask signal to generate second parity data,
- wherein the first parity data is generated based on the first partial parity data and the second partial parity data.

11. The semiconductor memory device of claim 10, wherein the conditional parity correction circuit comprises:
- a first exclusive OR gate configured to perform an exclusive OR on corresponding bits of the first partial parity data and the second partial parity data to generate the first parity data;
- a second exclusive OR gate configured to perform an exclusive OR on corresponding bits of the syndrome data and the first parity data during the write mode of the semiconductor memory device;
- a parity controller configured to generate a selection signal based on a position of the error bit and a memory location in which the main data to be written, wherein the position of the error bit is based on the syndrome data and the memory location is based on the data mask signal; and
- a multiplexer configured to output one of the first parity data and an output of the second exclusive OR gate as the second parity data, in response to the selection signal.

12. The semiconductor memory device of claim 9, wherein the ECC engine is disposed at a peripheral region of the semiconductor memory device and is shared by the error correction circuits.

13. A method of operating a semiconductor memory device including a memory cell array and an error correction circuit, the method comprising:
- generating syndrome data based on a first unit of data read from a memory location corresponding to an address received from an external memory controller, wherein the first unit of data includes a first sub unit of data, a second sub unit of data and old parity data;
- generating first parity data based on one of the first sub unit of data and the second sub unit of data and main data received from the memory controller; and
- performing a selective modification on the first parity data when the first sub unit of data includes at least one error bit based on a data mask signal received from the memory controller,
- wherein the selective modification comprises:
  - maintaining the first parity data when the main data is to be written into a memory location in which the first sub unit of data is stored; and
  - modifying the first parity data based on the syndrome data when the main data is to be written into a memory location in which the second sub unit of data is stored.

14. The method of claim 13, wherein the memory cell array includes a three dimensional memory cell array, and each of the plurality of bank arrays includes a plurality of dynamic memory cells or a plurality of resistive type memory cells.

15. A semiconductor memory device comprising:
a memory cell array including a plurality of bank arrays;
a control logic circuit configured to generate control signals by decoding a command from an external memory controller; and
an error correction circuit,
wherein the control logic circuit, during a write mode of the semiconductor memory device, is configured to control the error correction circuit to:
read a first unit of data from a selected sub page of a plurality of sub pages of a target page in the memory cell array, wherein the first unit of data comprises a first sub unit of data, a second sub unit of data and old parity data; and
generate first parity data based on one of the first sub unit of data and the second sub unit of data and main data to be written in the selected sub page while generating syndrome data by performing an error correction code (ECC) decoding on the first unit of data, and
wherein the error correction circuit comprises a selection circuit that is configured to output one of i) the first parity data and ii) second parity data based on the syndrome data and the first parity data, in response to a control signal.

16. The semiconductor memory device of claim 15, wherein the error correction circuit comprises:
a parity generator; and
a syndrome generation circuit,
wherein the parity generator generates the first parity data based on one of the first sub unit of data and the second sub unit of data and the main data while the syndrome generation circuit performs the ECC decoding on the read data to generate the syndrome data.

17. The semiconductor memory device of claim 15, wherein the error correction circuit comprises:
an ECC encoder; and
an ECC decoder configured to perform the ECC decoding on the read data, and correct at least one bit error in one of the first sub unit of data and the second sub unit of data.

18. The semiconductor memory device of claim 15, wherein the control signal is based on the syndrome data and a data mask signal indicating which of the first sub unit of data and the second sub unit of data is to be overwritten with the main data.

19. The semiconductor memory device of claim 18, where the syndrome data indicates whether the first unit of data has an error and a location of the error with respect to the first sub unit of data and the second sub unit of data.

20. The semiconductor memory device of claim 15, wherein the control logic circuit writes back a codeword to the memory cell array comprising the main data, one of the first sub unit of data and the second sub unit of data that has been corrected by the error correction circuit, and the output parity data.

* * * * *